United States Patent
Mohan

(10) Patent No.: US 7,800,411 B1
(45) Date of Patent: Sep. 21, 2010

(54) SYSTEM AND METHOD FOR PROVIDING A STROBED COMPARATOR WITH REDUCED OFFSET AND REDUCED CHARGE KICKBACK

(75) Inventor: Jitendra Mohan, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 148 days.

(21) Appl. No.: 11/342,783

(22) Filed: Jan. 30, 2006

(51) Int. Cl.
  *G11C 7/00* (2006.01)
  *G01R 19/00* (2006.01)
(52) U.S. Cl. .................... 327/57; 327/52; 365/203
(58) Field of Classification Search ............ 327/51, 327/55, 57; 365/203
  See application file for complete search history.

(56) References Cited

U.S. PATENT DOCUMENTS

| | | | | |
|---|---|---|---|---|
| 5,600,269 A | * | 2/1997 | Song et al. | 327/52 |
| 5,854,562 A | * | 12/1998 | Toyoshima et al. | 327/55 |
| 6,147,514 A | * | 11/2000 | Shiratake | 327/55 |
| 6,424,181 B1 | * | 7/2002 | Pogrebnoy | 327/55 |
| 6,433,601 B1 | * | 8/2002 | Ganesan | 327/202 |
| 6,888,380 B2 | * | 5/2005 | Aoki | 327/57 |
| 6,967,505 B2 | * | 11/2005 | Watarai | 327/55 |
| 7,200,060 B2 | * | 4/2007 | Beatty et al. | 365/203 |
| 2005/0162193 A1 | * | 7/2005 | Payne et al. | 327/52 |
| 2006/0002206 A1 | * | 1/2006 | Raad et al. | 365/201 |
| 2007/0109024 A1 | * | 5/2007 | Hung | 327/57 |

* cited by examiner

*Primary Examiner*—Lincoln Donovan
*Assistant Examiner*—Ryan C Jager

(57) ABSTRACT

A system and method is disclosed for providing a strobed comparator with reduced offset and reduced charge kickback. The strobed comparator circuit comprises a differential pair of transistors coupled to a first switch circuit, a regenerative latch circuit, a first strobe signal line coupled to the switch circuit and a second strobe signal line coupled to the regenerative latch circuit. The first and second strobe signal lines provide separate strobe controls. The differential pair of transistors reduces the charge kickback effect by remaining in an "on" state. The differential pair of transistors is enabled when the regenerative latch circuit is in a reset condition and the regenerative latch circuit is enabled when the differential pair of transistors is in a saturation condition.

20 Claims, 3 Drawing Sheets

SYSTEM AND METHOD FOR PROVIDING A STROBED COMPARATOR WITH REDUCED OFFSET AND REDUCED CHARGE KICKBACK

TECHNICAL FIELD OF THE INVENTION

The present invention is generally directed to manufacturing technology for semiconductor devices and, in particular, to a system and method for providing a strobed comparator with reduced offset and reduced charge kickback.

BACKGROUND OF THE INVENTION

Integrated circuit designers often use strobed comparators to achieve extremely high gains and good resolution. A strobed comparator is ideally designed to have low offset, a quick decision time and no static current. A strobed comparator works in two phases, a comparison phase and a reset phase. The comparison phase is carried out by two differentially connected transistors. In the comparison phase, input voltages are supplied to the two differentially connected transistors. A difference in the input voltages results in a difference in current that is fed to a regenerative latch that comprises two cross coupled transistors.

After the comparison phase has been completed, a reset phase is carried out. The regenerative latch must be reset to a balanced state to prepare the regenerative latch for the next comparison phase. The outputs of the strobed comparator become invalid after the strobed comparator has been placed in a reset phase. For this reason, a set reset (SR) latch coupled to the output of the strobed comparator holds the output values during the reset phase.

There are generally three methods to reset a strobed comparator. The first method employs a switch device on the common point of the differential pair of transistors. The second method employs a switch device on the output nodes of the differential pair of transistors. The third method employs a switch device across the regenerative latch in order to short the outputs together or to a common point. The third method is usually employed in conjunction with the first method or the second method in order to ensure a zero static current in the strobed comparator.

For purposes of illustrating the first method, consider an exemplary prior art strobed comparator circuit 100 shown in FIG. 1. The differential pair of transistors comprises N-type metal oxide semiconductor (NMOS) transistors M40 and M41. The regenerative latch comprises P-type metal oxide semiconductor (PMOS) transistors M10, M11, M20 and M21. PMOS transistors M20 and M21 are cross coupled. The switch device on the common point of the differential pair of transistors (M40 and M41) comprises NMOS transistor M31.

A strobe signal (designated "latch_b") is provided to the gate of NMOS transistor M31. As shown in FIG. 1, the "latch_b" strobe signal is also provided to the gates of PMOS transistors M10 and M11 of the regenerative latch circuit. Prior art strobed comparator 100 provides the lowest value of offset as the differential pair of transistors (M40 and M41) go from the "off" region to the "saturation" region. As a result, the differential pair of transistors (M40 and M41) has a gain that is greater than one ("1"). This gain reduces the effect of the offset from the regenerative latch portion of the circuit.

Furthermore, the strobe signal is common to the differential pair of transistors (M40 and M41) and does not contribute to the offset. The disadvantage of the approach illustrated in strobed comparator 100 is that the input capacitance of the differential pair of transistors (M40 and M41) must be charged by the preceding stage (not shown in FIG. 1) during the comparison phase and discharged during the reset phase. This creates a charge kickback effect in which the outputs of the previous stage create a glitch when the strobed comparator 100 is strobed. This feature makes it very difficult and challenging to design an appropriate preceding stage for strobed comparator 100.

For purposes of illustrating the second method, consider an exemplary prior art strobed comparator circuit 200 shown in FIG. 2. The differential pair of transistors comprises N-type metal oxide semiconductor (NMOS) transistors M40 and M41. The regenerative latch comprises P-type metal oxide semiconductor (PMOS) transistors M10, M11, M20 and M21. PMOS transistors M20 and M21 are cross coupled. The two switch devices on the output nodes of the differential pair of transistors (M40 and M41) comprise NMOS transistors M30 and M31.

A strobe signal (designated "latch_b") is provided to the gate of NMOS transistor M30 and to the gate of NMOS transistor M31. As shown in FIG. 2, the "latch_b" strobe signal is also provided to the gates of PMOS transistors M10 and M11 of the regenerative latch circuit. Prior art strobed comparator 200 provides a lower value of charge kickback but a much worse value of offset. The differential pair of transistors (M40 and M41) in strobed comparator 200 remains in the "linear" region during the reset phase and continue to be in the "linear" region during the start of the comparison phase. As a result, the differential pair of transistors (M40 and M41) has a gain that is less than one ("1") and amplifies the offset from the regenerative latch portion of the circuit.

However, because the differential pair of transistors (M40 and M41) remains always in the "on" state, the preceding stage (not shown in FIG. 2) does not have to provide significant charge during the comparison phase and during the reset phase. This reduces the charge kickback effect.

In view of the deficiencies of the prior art, there is a need for a system and method that is capable of providing a strobed comparator circuit that has a reduced value of offset and a reduced level of charge kickback. In particular, there is a need in the art for a system and method that is capable of minimizing the amount of offset and charge kickback in a strobed comparator circuit.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
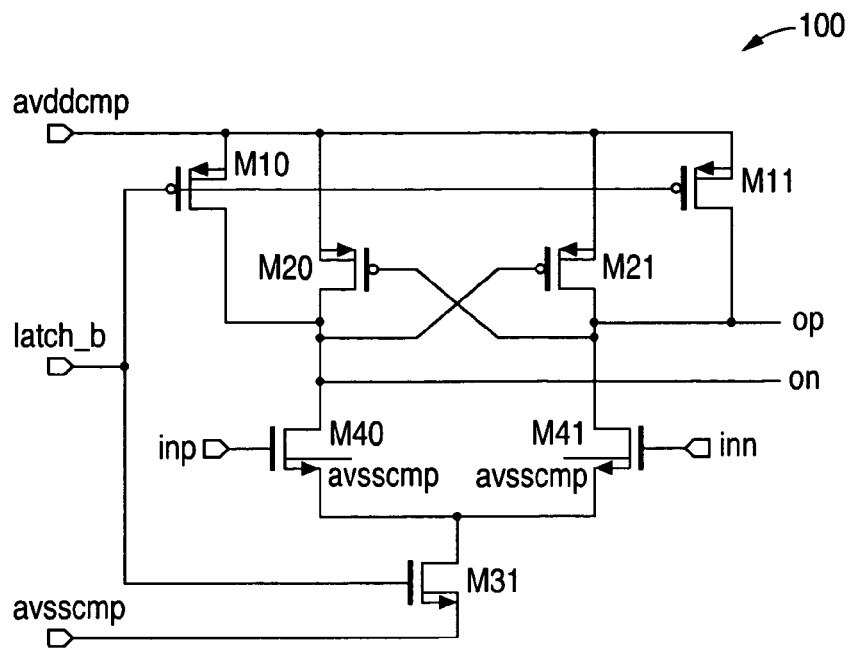
FIG. 1 illustrates a circuit diagram of a first type of prior art strobed comparator circuit.
Figure 2:
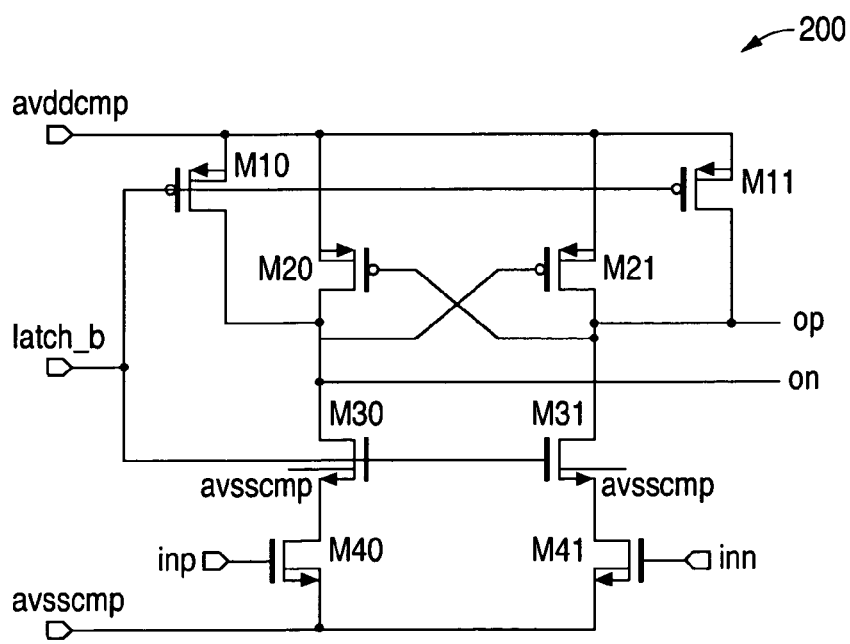
FIG. 2 illustrates a circuit diagram of a second type of prior art strobed comparator circuit.
Figure 3:
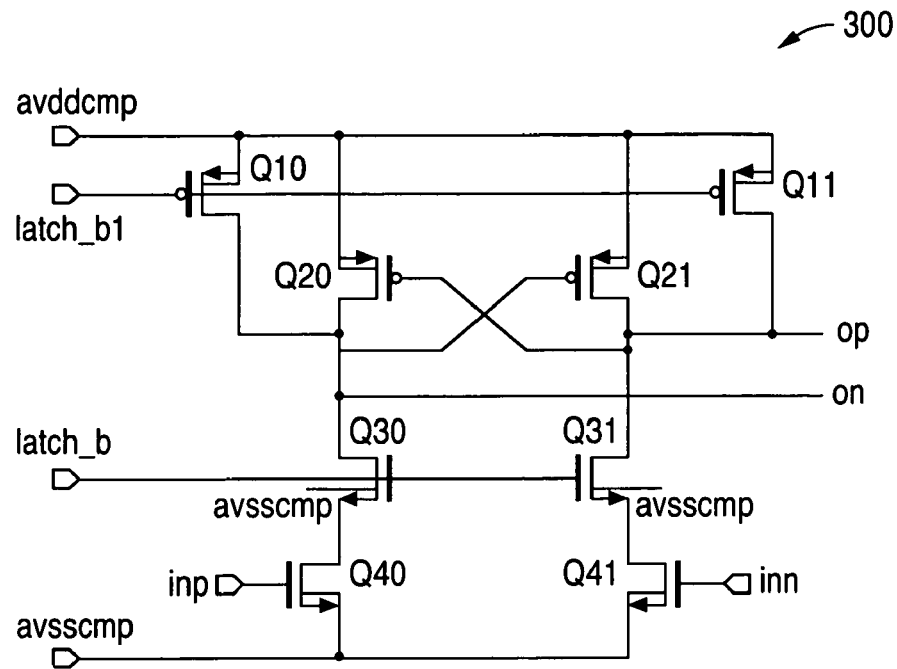
FIG. 3 illustrates a circuit diagram of a strobed comparator circuit of the present invention.
Figure 4:
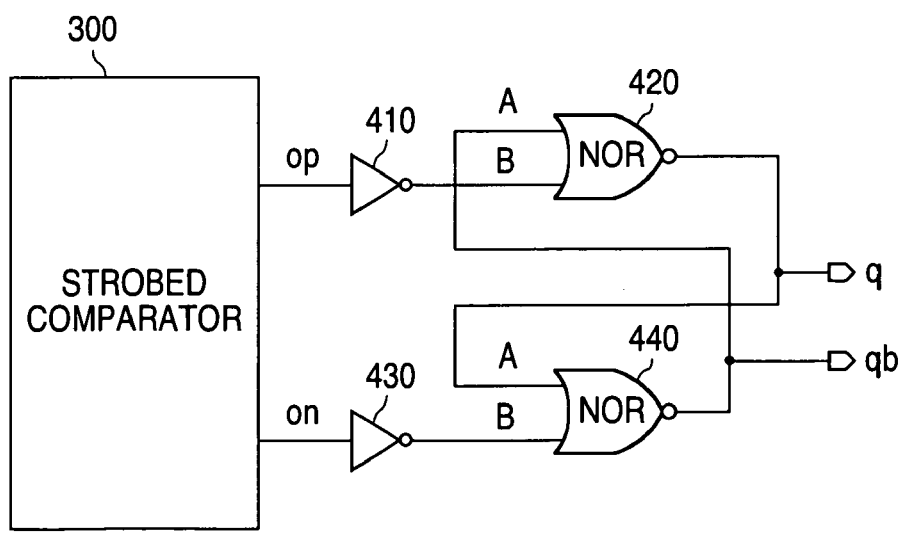
FIG. 4 illustrates a circuit diagram showing a set reset (SR) latch coupled to a strobed comparator circuit of the present invention.
Figure 5:
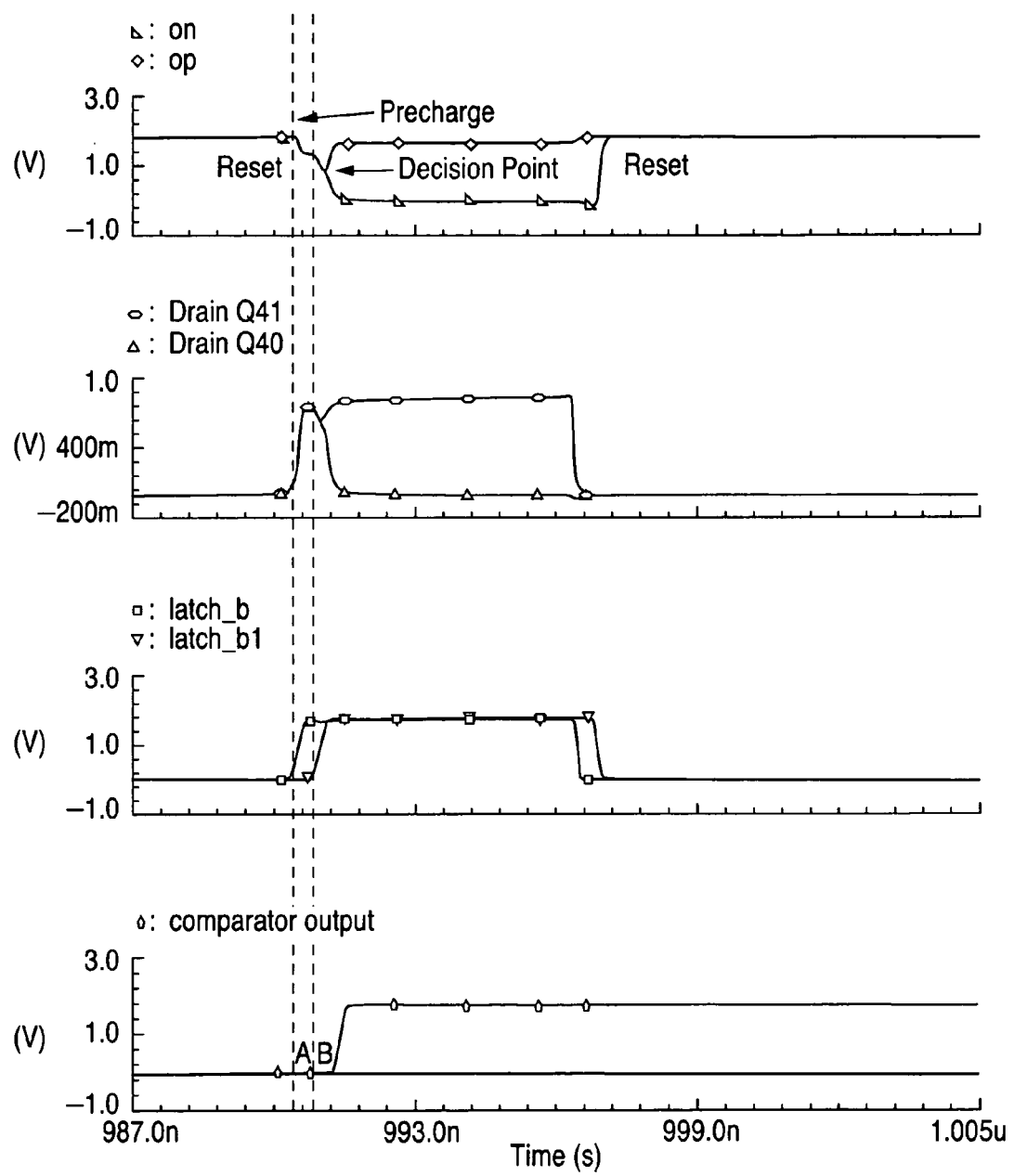
FIG. 5 illustrates four timing diagrams showing the variation over time of voltage signals utilized in the strobed comparator circuit of the present invention.

FIGS. 3 through 5, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged strobed comparator circuit.

A strobed comparator circuit 300 of the present invention is shown in FIG. 3. The strobed comparator circuit 300 provides (1) the reduced offset feature of prior art strobed comparator circuit 100, and (2) the reduced charge kickback feature of prior art strobed comparator circuit 200, and (3) zero static power.

The differential pair of transistors comprises N-type metal oxide semiconductor (NMOS) transistors Q40 and Q41. The regenerative latch comprises P-type metal oxide semiconductor (PMOS) transistors Q10, Q11, Q20 and Q21. PMOS transistors Q20 and Q21 are cross coupled. The two switch devices on the output nodes of the differential pair of transistors (Q40 and Q41) comprise NMOS transistors Q30 and Q31.

A first strobe signal (designated "latch_b") is provided to the gate of NMOS transistor Q30 and to the gate of NMOS transistor Q31. A second strobe signal (designated "latch_b1") is provided to the gates of PMOS transistors Q10 and Q11 of the regenerative latch circuit. The use of two strobe signals separates the strobe control of the regenerative latch and the strobe control of the differential pair.

The differential pair of transistors (Q40 and Q41) in strobed comparator 300 remains in the "linear" region during the reset phase and continue to be in the "linear" region during the start of the comparison phase. As a result, the differential pair of transistors (Q40 and Q41) has a gain that is less than one ("1") and amplifies the offset from the regenerative latch portion of the circuit.

However, because the differential pair of transistors (Q40 and Q41) remains always in the "on" state, the preceding stage (not shown in FIG. 3) does not have to provide significant charge during the comparison phase and during the reset phase. This reduces the charge kickback effect.

During the reset phase, the regenerative latch transistors (Q10, Q11, Q20, Q21) and the differential pair transistors (Q40 and Q41) are in reset, just the same as in strobed comparator 200. However, there is an immediate pre-charge phase of operation where the differential pair transistors (Q40 and Q41) are enabled but the regenerative latch transistors (Q10, Q11, Q20, Q21) are still held in reset.

During this pre-charge phase the differential pair transistors (Q40 and Q41) transition from the linear region (low gain) to the saturation region (high gain). After the differential pair transistors (Q40 and Q41) are in saturation and are ready for the comparison phase, the regenerative latch is released. This release defines the actual strobe point. Then the comparator makes a decision.

After the comparison phase, both the differential pair transistors (Q40 and Q41) and the regenerative latch transistors (Q10, Q11, Q20, Q21) enter the reset phase nearly simultaneously. During the entire operation the differential pair transistors (Q40 and Q41) remain in the "on" region. This reduces the charge kickback effect. Because the pre-charge phase enables the differential pair transistors (Q40 and Q41) to be in the saturation region, the offsets from the regenerative latch transistors (Q10, Q11, Q20, Q21) and the switch transistors (Q30 and Q31) are attenuated. This results in low overall offset. The strobed comparator 300 of the present invention provides reduced offset, reduced charge kickback and zero static power.

FIG. 4 illustrates a circuit diagram 400 showing a set reset (SR) latch coupled to strobed comparator 300 of the present invention. The "op" output of strobed comparator 300 is coupled to an input of inverter circuit 410. The output of inverter circuit 410 is coupled to a "B" input of NOR gate 420. The "on" output of strobed comparator 300 is coupled to an input of inverter circuit 430. The output of inverter circuit 430 is coupled to a "B" output of NOR gate 440.

The output of NOR gate 420 provides the "q" output of the set reset (SR) latch. The output of NOR gate 420 is also coupled to an "A" input of NOR gate 440. The output of NOR gate 440 provides the "qb" output of the set reset (SR) latch. The output of NOR gate 440 is also coupled to an "A" input of NOR gate 420. FIG. 4 illustrates how the strobed comparator 300 of the present invention is utilized in conjunction with a set reset (SR) latch.

FIG. 5 illustrates four timing diagrams showing the variation over time of voltage signals utilized in the strobed comparator 300 of the present invention. The vertical scale of the timing diagrams represents voltage and the horizontal scale of the timing diagrams represents time. The "Precharge" phase is shown in each diagram as occurring in time between the two lines that extend vertically across all four timing diagrams.

In the first timing diagram (top diagram) the output voltage signals "on" and "op" of strobed comparator 300 are shown. The "Decision Point" is located in time immediately after the end of the "Precharge" phase. In the second timing diagram (the first diagram under the top diagram) the voltage signals at the drain of transistor Q40 and the drain of transistor Q41 are shown. During the "Precharge" phase the differential pair of transistors (Q40 and Q41) transition from the linear region (low gain) to the saturation region (high gain).

In the third timing diagram (the second diagram under the top diagram) the voltage signals for the "latch_b" strobe signal and the "latch_b1" strobe signal are shown. The "latch_b" strobe signal begins its transition from "low" to "high" at the beginning of the "Precharge" phase. The "latch_b1" strobe signal begins its transition from "low" to "high" at the end of the "Precharge" phase. The regenerative latch portion of strobed comparator 300 is released after the differential pair of transistors (Q40 and Q41) is in saturation and ready for the comparison phase.

In the fourth timing diagram (the third diagram under the top diagram) the voltage signal for the comparator output is shown. The comparator makes a decision after the regenerative latch portion of strobed comparator 300 has been released.

As may be seen in the timing diagrams shown in FIG. 5, the voltage signals shown in the first three timing diagrams are subsequently reset. As shown in the third timing diagram the strobe signal "latch_b" for the differential pair of transistors and the strobe signal "latch_b1" for the regenerative latch circuit transistors are reset nearly simultaneously. The comparator output signal shown in the fourth timing diagram is not reset.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A strobed comparator circuit comprising:
    a differential pair of transistors comprising a first transistor and a second transistor that are configured to receive a differential signal, wherein the first transistor comprises at least one transistor terminal coupled to at least one transistor terminal of the second transistor, wherein the differential pair of transistors are configured to enter a pre-charge phase that places the transistors into a saturation condition;
    a regenerative latch circuit configured to receive currents from the differential pair of transistors, wherein the pre-charge phase enables the regenerative latch circuit to be attenuated, and wherein the regenerative latch circuit is configured so that a release of a regenerative latch defines a strobe point and promotes a reset state of both the regenerative latch circuit and the differential pair of transistors;
    a switch circuit coupled between the differential pair of transistors and the regenerative latch circuit;
    a first strobe signal line coupled to said switch circuit; and
    a second strobe signal line coupled to said regenerative latch circuit.

2. The strobed comparator circuit as set forth in claim 1 wherein said switch circuit comprises:
    a first switch transistor coupled to an output node of the first transistor of said differential pair of transistors; and
    a second switch transistor coupled to an output node of the second transistor of said differential pair of transistors.

3. The strobed comparator circuit as set forth in claim 2 wherein said first strobe signal line is coupled to a gate of said first switch transistor and to a gate of said second switch transistor.

4. The strobed comparator circuit as set forth in claim 1 wherein said second strobe signal line is coupled to a gate of a first transistor of said regenerative latch circuit and to a gate of a second transistor of said regenerative latch circuit.

5. The strobed comparator circuit as set forth in claim 1 wherein said first strobe signal line and said second strobe signal line provide separate strobe controls for said regenerative latch circuit and for said differential pair of transistors.

6. The strobed comparator circuit as set forth in claim 1 wherein said differential pair of transistors reduces a charge kickback effect of said strobed comparator circuit by remaining in an "on" state during an operation of said strobed comparator circuit.

7. The strobed comparator circuit as set forth in claim 1 wherein said differential pair of transistors is enabled during a period of time when said regenerative latch circuit is in the reset state.

8. The strobed comparator circuit as set forth in claim 1 wherein said regenerative latch circuit is enabled when said differential pair of transistors is in the saturation condition.

9. The strobed comparator circuit as set forth in claim 8 wherein an offset is attenuated from one or more of: at least one transistor of said regenerative latch circuit and at least one transistor of said switch circuit.

10. The strobed comparator circuit as set forth in claim 1 wherein said strobed comparator circuit is capable of operating with a reduced value of offset and with a reduced value of a charge kickback effect.

11. The strobed comparator circuit as set forth in claim 10 wherein said strobed comparator circuit is capable of operating with approximately zero static power.

12. The strobed comparator circuit as set forth in claim 1 coupled to a set reset latch.

13. A strobed comparator circuit comprising:
    a differential pair of transistors comprising a first transistor and a second transistor that are configured to receive a differential signal, wherein the first transistor comprises at least one transistor terminal coupled to at least one transistor terminal of the second transistor;
    a first switch circuit coupled to the differential pair of transistors;
    a regenerative latch circuit coupled to the differential pair of transistors through the first switch circuit, wherein the regenerative latch circuit is configured to receive currents from the differential pair of transistors, wherein the regenerative latch circuit comprises a second switch circuit, and wherein the regenerative latch circuit is configured so that a release of a regenerative latch defines a strobe point and promotes a reset state of both the regenerative latch circuit and the differential pair of transistors;
    a first strobe signal line coupled to said first switch circuit; and
    a second strobe signal line coupled to said second switch circuit.

14. The strobed comparator circuit as set forth in claim 13 wherein said first strobe signal line and said second strobe signal line provide separate strobe controls for said regenerative latch circuit and for said differential pair of transistors.

15. The strobed comparator circuit as set forth in claim 13 wherein said differential pair of transistors reduces a charge kickback effect of said strobed comparator circuit by remaining in an "on" state during an operation of said strobed comparator circuit.

16. The strobed comparator circuit as set forth in claim 13 wherein:
    said differential pair of transistors is enabled during a period of time when said regenerative latch circuit is in the reset state; and
    wherein said regenerative latch circuit is enabled when said differential pair of transistors is in a saturation condition.

17. A method comprising the steps of:
    pre-charging a pair of differential transistors so that the pair of differential transistors is in a saturation condition;
    defining a strobe point in a strobed comparator circuit that comprises the differential pair of transistors coupled to a first switch circuit and a regenerative latch circuit coupled to said differential pair of transistors through the first switch circuit, wherein release of a regenerative latch defines the strobe point;

enabling said differential pair of transistors during a period of time when said regenerative latch circuit is in a reset condition;

enabling said regenerative latch circuit when said differential pair of transistors is in the saturation condition;

applying a voltage to the differential pair of transistors to keep the differential pair of transistors in an on-region; and attenuating an offset of one or more of: at least one transistor in the first switch circuit and at least one transistor in the regenerative latch circuit.

18. The method as set forth in claim 17 wherein the attenuation results in a low overall offset.

19. The method as set forth in claim 17 further comprising the step of:

attenuating both the offset of the at least one transistor of the regenerative latch circuit and the offset of the at least one transistor of the first switch circuit.

20. The method as set forth in claim 17, wherein the differential pair of transistors reduces a charge kickback effect of the strobed comparator circuit by remaining in an "on" state during an operation of the strobed comparator circuit.

* * * * *